(12) United States Patent
Chiang

(10) Patent No.: US 8,658,997 B2
(45) Date of Patent: Feb. 25, 2014

(54) BIPOLAR MULTISTATE NONVOLATILE MEMORY

(75) Inventor: Tony P. Chiang, Campbell, CA (US)

(73) Assignees: Intermolecular, Inc., San Jose, CA (US); Kabushiki Kaisha Toshiba, Tokyo (JP); Sandisk 3D LLC, Milpitas, CA (US)

(*) Notice: Subject to any disclaimer, the term of this patent is extended or adjusted under 35 U.S.C. 154(b) by 80 days.

(21) Appl. No.: 13/396,397

(22) Filed: Feb. 14, 2012

(65) Prior Publication Data

US 2013/0207065 A1    Aug. 15, 2013

(51) Int. Cl.
*H01L 45/00*        (2006.01)
(52) U.S. Cl.
USPC ............................................................ 257/2
(58) Field of Classification Search
USPC ................................................. 257/2; 438/3
See application file for complete search history.

(56) References Cited

U.S. PATENT DOCUMENTS

| 8,101,937 B2* | 1/2012 | Chiang | 257/2 |
| 2009/0026433 A1* | 1/2009 | Chiang | 257/2 |
| 2012/0091417 A1* | 4/2012 | Chiang | 257/2 |

* cited by examiner

*Primary Examiner* — Thao P Le

(57) ABSTRACT

Embodiments generally include a method of forming a nonvolatile memory device that contains a resistive switching memory element that has an improved device switching capacity by using multiple layers of variable resistance layers. In one embodiment, the resistive switching element comprises at least three layers of variable resistance materials to increase the number of logic states. Each variable resistance layer may have an associated high resistance state and an associated low resistance state. As the resistance of each variable resistance layer determines the digital data bit that is stored, the multiple variable resistance layers per memory element allows for additional data storage without the need to further increase the density of nonvolatile memory devices. Typically, resistive switching memory elements may be formed as part of a high-capacity nonvolatile memory integrated circuit, which can be used in various electronic devices, such as digital cameras, mobile telephones, handheld computers, and music players.

15 Claims, 10 Drawing Sheets

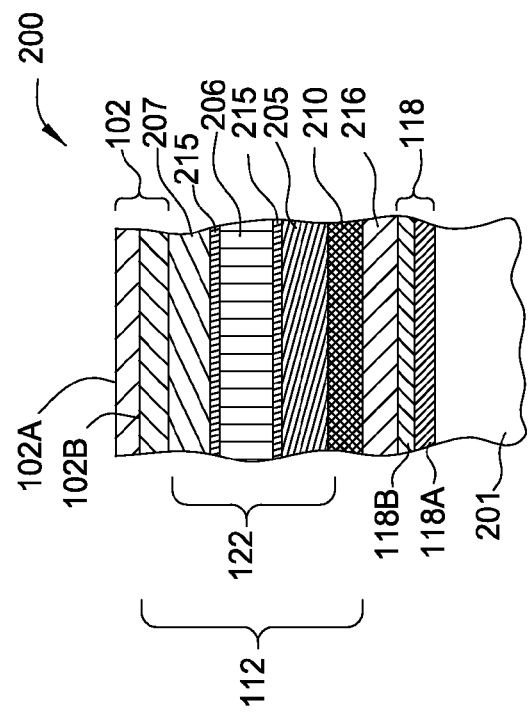
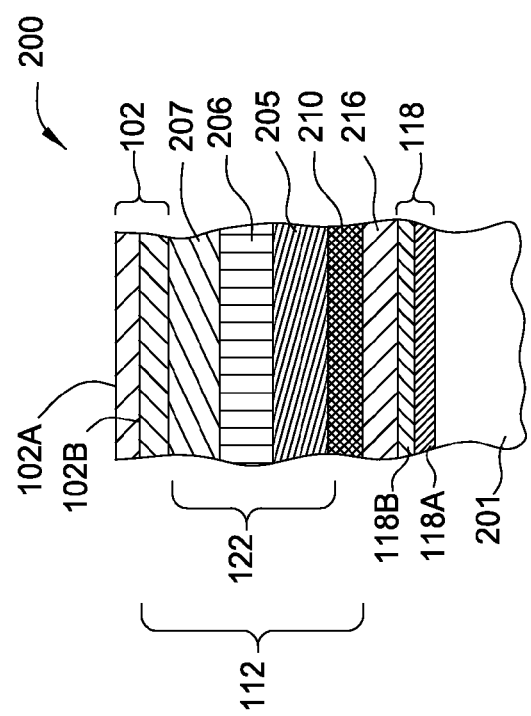

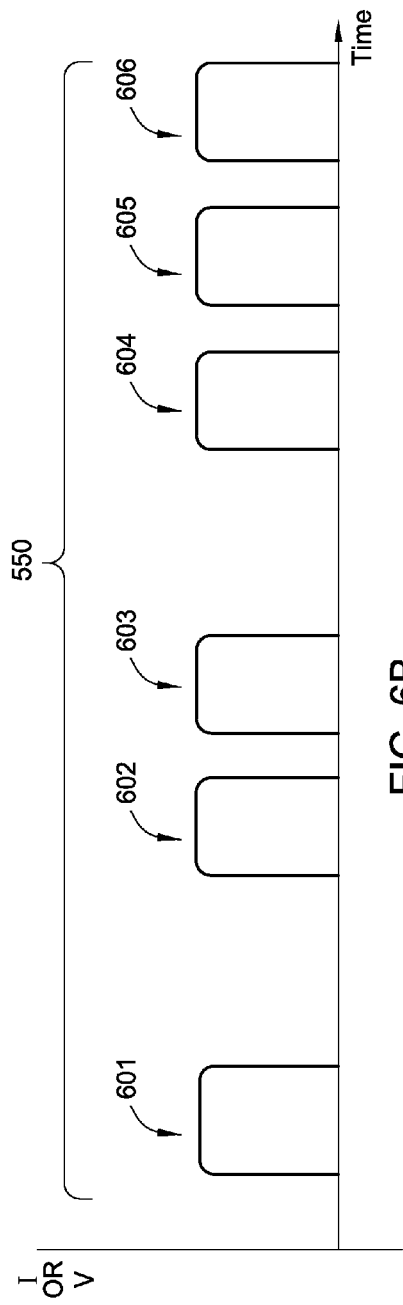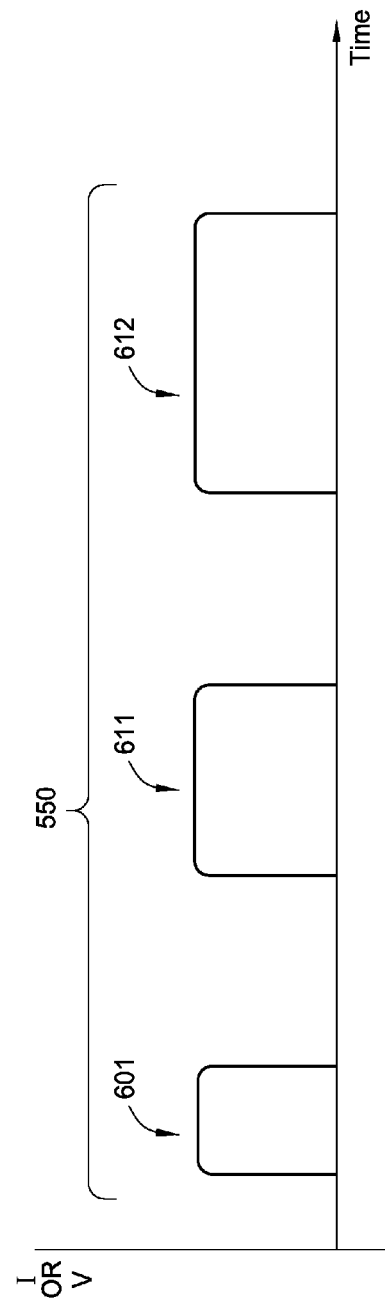

BIPOLAR MULTISTATE NONVOLATILE MEMORY

BACKGROUND OF THE INVENTION

1. Field of the Invention

This invention relates to nonvolatile memory elements, and more particularly, to methods for forming resistive switching memory elements with multiple variable resistance layers.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data used by a computer.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Higher memory densities enable greater storage capabilities with smaller form factors. Traditionally this is achieved by shrinking device dimensions (e.g. memory cell size), stacking memory chips in integrated chips in integrated packages, and combinations thereof. However, the above methods may introduce additional cost and complexity. It would therefore be desirable to further increase the densities of nonvolatile memories without relying solely on physical scaling and/or stacking alone.

SUMMARY OF THE INVENTION

Embodiments of the invention generally relate to a resistive switching nonvolatile memory device having multiple layers of variable resistance switching material within a resistive switching memory element that are configured to increase the number of logic states to be greater than two per memory element. The resistive switching memory element may have any suitable number of variable resistance switching layers (hereafter variable resistance layers). If the memory element has a total of "n" variable resistance layers, where "n" is a positive integer, the resistive switching memory element may exhibit "n+1" stable states. The variable resistance layers each having different switching characteristics can be formed by varying the layers materials or material properties. The memory element device decreases the vertical or horizontal physical density requirements necessary to achieve the same nonvolatile storage capacity and reduces the complexity of the nonvolatile memory device manufacturing process.

A method of forming a nonvolatile memory device that contains a resistive switching memory element that has an improved device switching capacity by using multiple layers of variable resistance switching layers is provided. In one embodiment, a multistate nonvolatile memory element includes a first layer, a second layer and a third layer. The first layer is operable as variable resistance layer having a first low resistance state and a first high resistive state. The first layer comprises a first material. The second layer is operable as a variable resistance layer connected in series with the first layer. The second layer has a second low resistance state and a second high resistance state. The second layer comprises a second material. The third layer is operable as a variable resistance layer and is connected in series with the first layer and the second layer. The third layer has a third low resistance state and a third high resistance state. The third layer comprises the second material and a chemical element that is not found in the second layer. The multistate nonvolatile memory element has at least four different stable resistive states.

In another embodiment a multistate nonvolatile memory element includes a first layer, a second layer and a third layer. The first layer comprises a first layer and is operable as variable resistance layer having a first low resistance state and a first high resistive state. The first layer comprises a first material. The second layer is operable as a variable resistance layer and is connected in series with the first layer. The second layer has a second low resistance state and a second high resistance state and the second layer comprises a second material. The third layer is operable as variable resistance layer and is connected in series with the first layer and the second layer. The third layer has a third low resistance state and a third high resistance state and the third layer comprises a third material. The first layer, the second layer and the third layer each comprise at least one different chemical element from the other layers. The multistate nonvolatile memory element has at least four different stable resistive states.

In yet another embodiment, a multistate nonvolatile memory element includes a first layer, a second layer and a third layer. The first layer is operable as variable resistance layer having a first low resistance state and a first high resistive state. The first layer comprises a first material. A second layer is operable as a variable resistance layer connected in series with the first layer. The second layer has a second low resistance state and a second high resistance state and the second layer comprises a second material. The third layer is operable as variable resistance layer connected in series with the first layer and the second layer. The third layer has a third low resistance state and a third high resistance state and the third layer comprises a third material. The material of the first layer, the second layer and the third layer each comprise a first chemical element and a second chemical element, and the ratio of the first chemical element to the second chemical element in the first layer, second layer and third layer are each different. The multistate nonvolatile memory element has at least four different stable resistive states.

In still another embodiment of the present invention sets forth a stack of multistate nonvolatile memory elements that includes a first memory element and a second memory element. The first memory element includes a first layer, second layer and third layer. The first layer is operable as variable resistance layer having a first low resistance state and a first high resistive state. The first layer comprises a first material. The second layer is operable as a variable resistance layer connected in series with the first layer. The second layer has a second low resistance state and a second high resistance state. The second layer second layer comprises a second material. The third layer is operable as variable resistance layer connected in series with the first layer and the second layer. The third layer has a third low resistance state and a third high resistance state. The third layer comprises a third material. The first, second and the third high resistance states are different for each layer. The multistate nonvolatile memory element has at least four different stable resistive states. The second memory element comprises multiple variable resistance layers comprising at least four different stable resistive states. A fourth layer is operable as an electrode and a word-line and bit-line, and is disposed between the first and second memory elements.

In still another embodiment of the present invention sets forth a method of storing information in a multistate nonvolatile memory element. The method comprises delivering a first current in a first direction through the memory element that comprises a first variable resistance layer, a second variable resistance layer and a third variable resistance layer. The first variable resistance layer, the second variable resistance layer and the third variable resistance layer each have a high resistance state and a low resistance state. The first current causes the first variable resistance layer to switch from its high resistance state to its low resistance state while the second variable resistance layer and the third variable resistance layer each remain in their high resistance state. Delivering a second current in the first direction through the memory element causes the second variable resistance layer to switch from its high resistance state to its low resistance state while the first variable resistance layer remains in its low resistance state and the third variable resistance layer remains in its high resistance state. Delivering a third current in the first direction through the memory element causes the third variable resistance layer to switch from its high resistance state to its low resistance state while the first variable resistance layer and the second variable resistance layer each remain in their low resistance state. Applying a fourth current in a second direction through the multistate nonvolatile memory element causes the variable resistance layers of the memory element to each switch from their low resistance state to their high resistance state.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a schematic side cross-sectional view of a memory element disposed in a nonvolatile memory device in accordance with an embodiment of the invention.

FIG. 3B is a schematic side cross-sectional view of a memory element illustrated in accordance with an embodiment of the invention.

FIGS. 6A-6C are graphs illustrating the multistate behavior of a memory element of the type illustrated in FIG. 3A

While the foregoing is directed to embodiments of the present invention, other and further embodiments of the invention may be devised without departing from the basic scope thereof, and the scope thereof is determined by the claims that follow.

DETAILED DESCRIPTION

Embodiments of the invention generally include a method of forming a nonvolatile memory device that contains a resistive switching memory element that has multiple variable resistance layers. Each variable resistance layer may have at least an associated high resistance state and an associated low resistance state (e.g., two stable states). As the resistance of each variable resistance layer determines the digital data that is stored (e.g., logic "zero" or logic "one"), the multiple variable resistance layers per memory element allow for additional data storage without the need to further increase the size of the nonvolatile memory device and array of nonvolatile memory devices that contain multiple memory elements.

Figure 1:
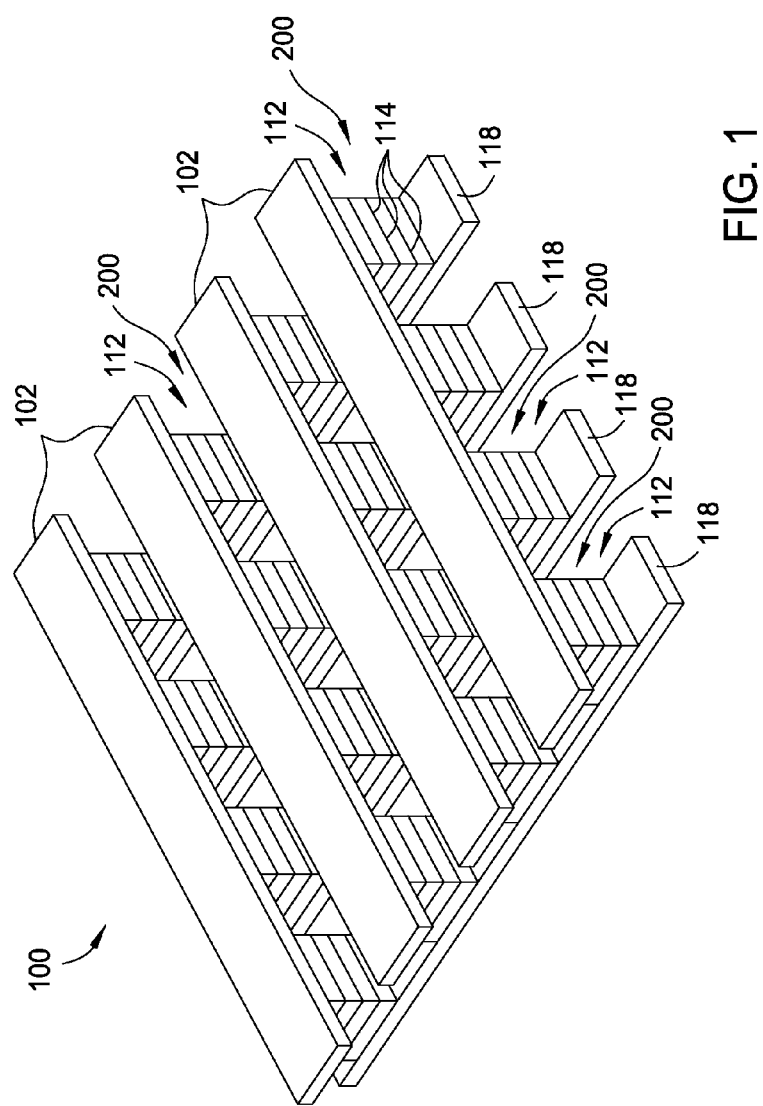
FIG. 1 illustrates an array of resistive switching memory elements in accordance with an embodiment of the invention.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system-on-a-chip type device. Read and write circuitry is connected to switching memory devices 200 using word-lines and orthogonal bit-lines, which are referred to herein generally as electrodes 102 and 118, and are used to read from or write data into the memory element 200. Electrodes 102 and 118, generally include one or more conductive layers that each have a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit-lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

Figure 2A:
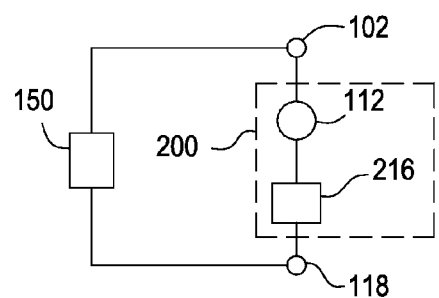
FIG. 2A is schematic representation of a memory device in accordance with an embodiment of the invention.

FIG. 2A schematically illustrates one example of a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example, the current steering device 216 may include two or more layers of semiconductor material, such as two or more doped silicon layers, that are configured to allow or inhibit the current flow in different directions through the memory element 112. In addition, read and write circuitry 150 is coupled to memory device 200 via electrodes 102 and electrodes 118 as shown. Read and write circuitry 150 is configured to both reset the resistance state and set the resistance state of memory device 200.

Figure 2B:
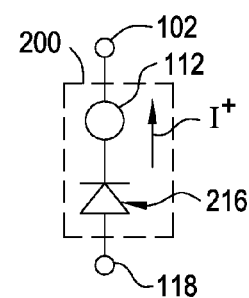
FIG. 2B is schematic representation of a memory device having a diode type current steering element in accordance with an embodiment of the invention.

FIG. 2B schematically illustrates a switching memory device 200 that contains a memory element 112 and a diode type current steering device 216 that preferentially allows current to flow through the memory device 200 in a forward direction ("I$^+$"). However, due to the design of the current steering device 216, a reduced current can also flow in the opposing direction through the device by the application of a reverse bias to the electrodes 102 and 118.

During operation, such as a read operation, the state of a memory element 112 in the switching memory device 200 can be sensed by applying a sensing voltage (i.e., a "read" voltage $V_{READ}$), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "zero" (i.e., a "0" bit). If, on the other hand, the memory element is in the low resistance state, the memory element may be said to contain a logic "one" (i.e., a "1" bit). During a write operation, the state of memory element 112 can be changed by application of suitable write signals to an appropriate set of electrodes 102 and 118.

Memory elements 112 in accordance with the invention preferably contain two or more variable resistance layers connected in series. As an example, memory element 112 that contains two variable resistance layers connected in a series may be formed so that each of the variable resistance layers has a different high resistance and/or low resistance state. Commonly, variable resistance layers that have different high resistance states, will have a different corresponding "set" programming voltage. To form each of the variable resistance layers so that they each have a different resistive switching property, each of the variable resistance layers may be formed using different deposition and/or processing techniques to tailor the switching properties of each of the layers. In one configuration, the switching properties are tailored by adjusting the resistance of each of the formed layers by varying layer thickness, layer composition, the doping level of each layer, varying the crystal structure and other similar material properties. In this example, with each variable resistance layer having different resistive switching properties, the memory element may exhibit three stable states. In one example, both variable resistance layers are in their high resistant state. One of the variable resistance layers is in its low resistance state, and both of the variable resistance layers are in their low resistance state.

Memory elements 112 with more than two variable resistance layers can be connected in series to form an array of devices that each have "n" variable resistance layers exhibiting "n+1" stable states. The use of multiple variable resistance layers to form multiple stable resistive states increases the information storing capacity of each individual memory element 112 without significantly increasing the area occupied by the memory element 112. Where a memory element that has a single variable resistance layer may only store one bit (e.g., 1 or 0), memory elements that contain three variable resistance layers will have four stable states, and thus be able to store two bits. The additional stable states available in multistate memories with two or more variable resistance layers allows memory array 100 of FIG. 1 to exhibit high storage capacities and also reduce the number of stacked memory arrays 100 necessary to achieve the equivalent memory storage capacity.

FIG. 3A is a schematic side cross-sectional view of one embodiment of an improved switching memory device 200. Switching memory device 200 contains a memory element 112 that has a multistate variable resistance element 122 made of three variable resistance layers 205, 206 and 207, which are connected in series with and are disposed between electrodes 102 and 118, formed over a portion of a substrate 201. The switching memory device 200 contains a memory element 112 that exhibits four stable states. In this configuration, the memory element 112 will generally contain a top electrode 102, variable resistance layers 205, 206 and 207, an optional intermediate electrode 210 (additional conductive layer), a current steering device 216, and a bottom electrode 118. Variable resistance switching layers 205, 206 and 207 preferably each have a different respective associated set voltage, so that the state of each of the variable resistance switching layers can be controlled independently. The variable resistance layers 205, 206 and 207 may be arranged in any suitable order.

The variable resistance layers 205, 206 and 207 disposed in switching memory device 200 can comprise a dielectric material, such as a metal oxide material or other similar material that can be switched between at least two or more stable resistive states. In some embodiments, suitable materials for the variable resistance layers 205, 206 and 207 are a high bandgap material (e.g., bandgap>4 electron volts (eVs)), such as hafnium oxide ($Hf_xO_y$), tantalum oxide ($Ta_xO_y$), aluminum oxide ($Al_xO_y$), zirconium oxide ($Zr_xO_y$), lanthanum oxide ($La_xO_y$), yttrium oxide ($Y_xO_y$), dysprosium oxide ($Dy_xO_y$), ytterbium oxide ($Yb_xO_y$), lutetium oxide ($Lu_xO_y$), lanthanum aluminum oxide ($La_xAl_yO_z$) and lanthanum lutetium oxide ($La_xLu_yO_z$). It has been found that using high band gap variable resistance layer materials will improve data retention in the memory element 112, and reduce the leakage current in the formed memory element device, since the amount of trapped charge in the variable resistance layer material will be less than a lower band gap material, and the high band gap materials create a large barrier height that the carriers have to cross during the read, set and reset operations. In other embodiments, lower bandgap metal oxide materials can be used, such as titanium oxide ($TiO_x$), nickel oxide ($NiO_x$) or cerium oxide ($CeO_x$) may be advantageous for some embodiments. In some cases, a semiconductive metal oxide (p-type or n-type), such as zinc oxides ($Zn_xO_y$), copper oxides ($Cu_xO_y$), and their nonstoichiometric and doped variants can be used. The variable resistance layers 205, 206 and 207 may comprise a metal oxide (e.g., $HfO_2$) layer formed to a thickness of between about 10 and about 100 angstroms (Å). In one configuration, one or more of the variable resistance layers 205, 206 and 207 may be doped with a chemical element material that has an affinity for oxygen (e.g., chemical elements found on the periodic table including transition metals (aluminum (Al), titanium (Ti), zirconium (Zr), cobalt (Co), vanadium (V), niobium (Nb)) to form a variable resistance layer that has resistive switching properties that are different than an undoped variable resistance layer. In another configuration, the variable resistance layer may be formed so that it is a metal-rich variable resistance layer (e.g., $HfO_{1.7}$ vs. $HfO_2$), which is deficient in oxygen, and thus has a larger number of oxygen vacancy type defects. The additional vacancy defects can reduce the required switching and forming voltages, reduce the device operating current(s), and reduce the device to device variation in a formed memory element. In one example, one or more of the variable resistance layers 205, 206 and 207 may each comprise a metal oxide layer, such as $Hf_xO_y$, $Ta_xO_y$, $Al_xO_y$, $La_xO_y$, $Y_xO_y$, $Dy_xO_y$, $Yb_xO_y$ and/or $Zr_xO_y$, formed to a thickness of between about 10 and about 100 Å, such as between about 15 and about 50 Å. In one configuration the two or more of the variable resistance layers are formed from a metal oxide layer that has as a different composition (e.g., doping, level, stoichiometry, material compound). Each of the variable resistance layers 205, 206 and 207 may be deposited using any desired technique, but in some embodiments described herein is deposited using an ALD process. In other embodiments, the variable resistance layers 205, 206 and 207 can be deposited using a CVD (e.g., LPCVD, PECVD) or ALD (e.g., PEALD), physical vapor deposition (PVD), liquid deposition processes, and epitaxy processes. It is believed that PEALD processes can be used to control defects and improve switching and forming voltages in some embodiments. In one example, an ALD process using tetrakis(dimethylamino)hafnium (TDMAH) and an oxygen containing precursor at a temperature of about 250° C. is used to form a 30 Å thick hafnium oxide ($Hf_xO_y$) containing variable resistance layer 205, 206, or 207.

In one configuration, as shown in FIG. 3B, variable resistance element 122 may optionally include one or more interfacial conductive layers 215, which may act as additional work-function enhancing interfacial electrodes that are connected in series with the series-connected variable resistance layers 205, 206 and 207. If desired, there may be an interfacial conductive layer 215 adjacent to each variable resistance layer. The interfacial conductive layers 215 may be formed of any suitable conductive material. For example, from metals such as refractory or transition metals, metal alloys, metal nitrides (e.g. refractory metal nitrides, $Ti_{1-x}Al_xN_y$, $Ta_{1-x}Al_xN_y$, $W_{1-x}Al_xN_y$, $Mo_{1-x}Al_xN_y$, etc.) metal silicon nitrides (i.e., materials containing refractory metals, transition metals, or other metals, along with silicon and nitrogen), metal silicides, doped semiconductors, or other conductors. Other intermediate layers having various functions may also be included. For example, additional interfacial layers may be included between variable resistance layers 205, 206 and 207 and interfacial conductor layers 215 to modify the work function, layer adhesion properties, and/or act as a diffusion barrier between the variable resistance layers.

In one embodiment, as illustrated in FIG. 3A, the electrodes 102 and 118 may each comprise more than one layer of conductive material. In one configuration, the top electrode 102 may comprise a first conductive layer 102A and a second conductive layer 102B, and the bottom electrode 118 may comprise a first conductive layer 118A and a second conductive layer 118B. In this case, the first conductive layer 102A in the top electrode 102 and the first conductive layer 118A in the bottom electrode 118 can be used to interconnect multiple switching memory devices 200 in an array of formed devices, and thus may act as word-lines or bit-lines (as described below and shown in FIGS. 7A and 7B). The second conductive layer 102B and the second conductive layer 118B may each comprise a material that has desirable electrical properties (e.g., work function) so that these layers can help improve the electrical characteristics of the memory element 200. The first conductive layer 102A and/or first conductive layer 118A may comprise, for example, tungsten (W), aluminum (Al) or copper (Cu), while the second conductive layer 102B and/or the second conductive layer 118B may comprise, for example, titanium (Ti), titanium nitride (TiN), or doped polysilicon. One will note that the configuration shown in FIG. 3A and discussed herein is not intended to limiting as to the scope of the invention described herein, since, for example, the electrodes 102 and 118 may comprise a single conductive layer, and the position of the various layers, or number of layers, in the stack of layers used to form switching memory device may be altered without deviating from the basic scope of the invention described herein.

In one embodiment, as shown in FIG. 3A, one or more electrical components may be connected in series with memory element 112. These components, often referred to as current steering elements, may include, for example, diodes, p-i-n diodes, silicon diodes, silicon p-i-n diodes, transistors, etc. In one example, the current steering element 216 is connected in series with variable resistance layers 205, 206, and 207 and is disposed in the lower portion of the device. One will note that two or more current steering elements may be connected in series with other components of memory switching device 200. In one example, the current steering elements may be connected to the outermost resistive switching layers so as not to be interspersed between the resistive switching layers.

Figure 4:
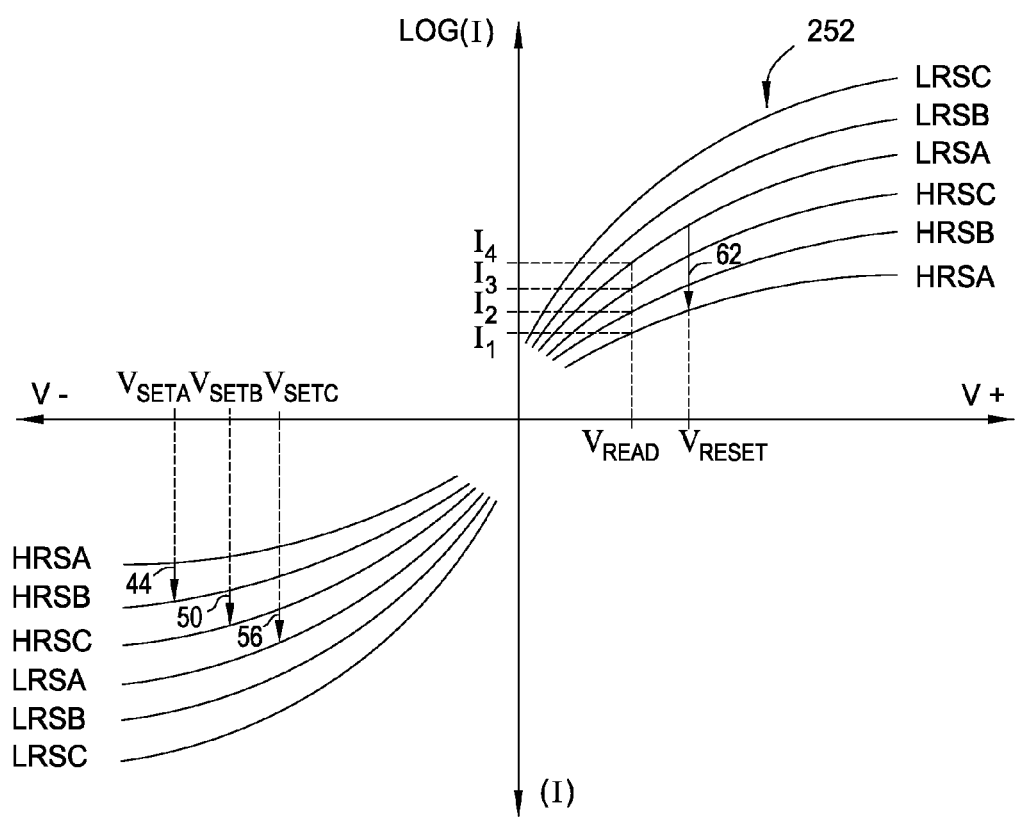
FIG. 4 is a current versus voltage plot illustrating the effect of delivering switching pulses through a memory element in accordance with an embodiment of the invention.

In some embodiments, the memory element 112 uses bipolar switching where opposite polarity "set" and "reset" voltages are used to alter the resistance of the memory element between high and low resistance states. FIG. 4 schematically illustrates a log-log plot of current (I) versus voltage (V) of one example of bipolar switching curves 252 of a resistive switching type of memory element, and thus illustrates typical threshold values used to "set" and "reset" the three different variable resistance layers 205, 206 and 207 of a memory element 112. The three different variable resistance layers in memory element 112 have three corresponding pairs of current versus voltage characteristics. The high resistance state of variable resistance layer 205 is depicted by line HRSA. The low resistance state of variable resistance layer 205 is depicted by line LRSA. The high resistance state of variable resistance layer 206 is depicted by line HRSB. The low resistance state of variable resistance layer 206 is depicted by line LRSB. The high resistance state of variable resistance layer 207 is depicted by line HRSC. The low resistance state of variable resistance layer 207 is depicted by line LRSC.

The current versus voltage characteristics of FIG. 4 represents the resistive characteristics of each variable resistance layer as a function of an applied voltage if these characteristics were measured individually. These characteristic curves, or load lines, are plotted together in FIG. 4 to show the relationships between the resistive characteristics of each layer and the memory element 112 as a whole.

The resistance of memory element 112 is determined by the sum of the resistances of each variable resistance layer at any given time. In some preferred embodiments, however because the resistance of the layers may differ significantly (e.g., by an order of magnitude), the resistances of the lower resistance switching layers can be neglected when determining the approximate total resistance of memory element 112. For example as shown in FIG. 4, the resistance of HRSA is greater than the resistance of HRSB, which is greater than the resistance of HRSC, which is further greater than the resistance of LRSA, and so on. When variable resistance layer 205 is in its high resistance state, the total resistance of memory element 112 appears to be approximately HRSA, since the resistance of HRSA is greater than the resistance of HRSB (e.g., HRSA/HRSB=>5-10). When variable resistance layer 205 switches to its low resistance state LRSA, the resistance of memory element 112 then appears to have a resistance of HRSB. Next, when variable resistance layer 206 switches to its low resistance state (LRSB), the resistance of memory element 112 then appears to have a resistance of HRSC. In some embodiments, the resistance of every high resistance state is greater than the resistance of every low resistance state, so the lowest high resistance state (e.g., HRSC) has a greater resistance that the highest low resistance state (e.g., LRSA). As a result, in any given stable state of memory element 112, the series resistance of memory element 112 will be substantially equal to the resistance of the most resistive variable resistance layer. Then when variable resistance layer 207 switches to its low resistance state (LRSC), the resistance of memory element 112 then appears to be the sum of the low resistance states (e.g. LRSA+LRSB+LRSC), but in some cases may equal LRSA, since this resistance dominates the stack resistance.

Figure 5:
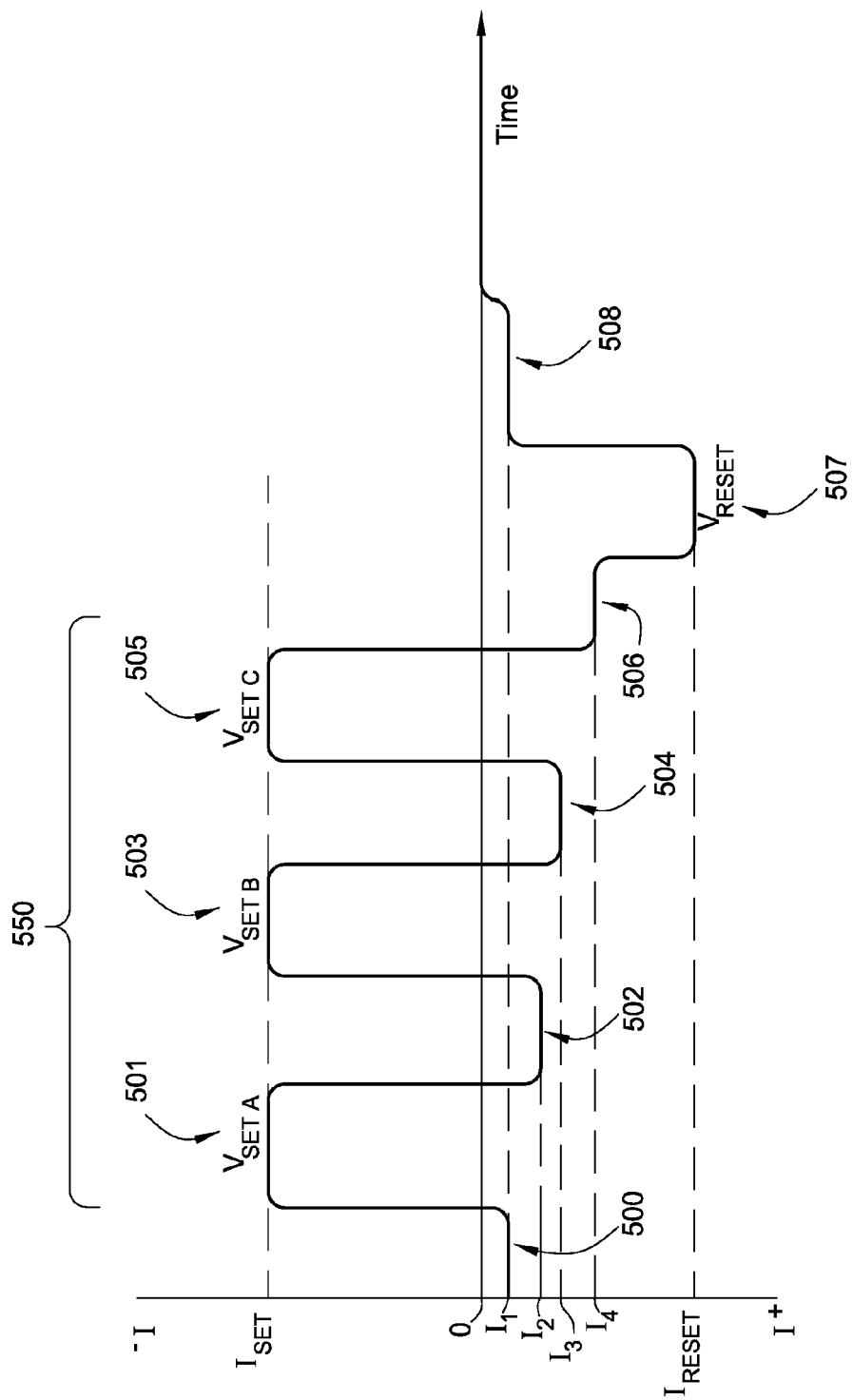
FIG. 5 is a graph illustrating the multistate behavior of a memory element of the type illustrated in FIG. 3A.

The states of the variable resistance layers can be controlled by the application of suitable programming voltages across memory element 112 as shown in both FIGS. 4 and 5. FIG. 5 illustrates a series of programming pulses that can be applied to the memory device to control the various memory states of the device 200. The high resistance state of memory element 112 can be sensed by read and write circuitry 150 (FIG. 2A) using electrodes 102 and 118. For example, the memory controlling circuitry can use the read and write circuitry to apply a read pulse 500 (FIG. 5) to memory element 112. If the memory element 112 is in its highest resistance state, such as the memory element resistance is approximately equal to HRSA, a resulting current ($I_1$) will flow through memory element 112. In this state memory element 112 is in a state in which all variable resistance layers, including variable resistance layer 205, are in their high resistive states. When sensing 500, or $V_{READ}$ pulse, is applied to memory element 112, the measured current will be will be ($I_1$), as shown in FIGS. 4 and 5, indicating that memory element 112 is in its first stable state (i.e., its highest resistance state).

To place memory element 112 in its second stable resistive state, a "set" pulse 501 (FIG. 5) may be applied to memory element 112, causing variable resistance layer 205 to switch from a high resistance state to a low resistance state, with layers 206 and 207 remaining in their high resistance state. Referring to FIG. 4, switching variable resistance layer 205 from its high resistance state to its low resistance state will cause the device to switch from load line HRSA to load line HRSB, as shown by arrow 44. When the "set" pulse 501 is first applied to memory element 112, most of the voltage drop in memory element 112 appears across its most resistive layer (i.e., variable resistance layer 205). As a result, the voltage across variable resistance layer 205 is substantially equal to $V_{SETA}$. This causes variable resistance layer 205 to transition from its high resistance state (line HRSA) to its low resistance state (line LRSA).

As noted above, when variable resistance layer 205 transitions to its low resistance state (LRSA), variable resistance layer 205 is no longer the most resistive layer in memory element 112. Rather variable resistance layer 206 which is in its high resistive state becomes the most resistive layer. At this stage, memory element 112 is in its second stable resistive state. The state of memory element 112 may be sensed by applying a sensing pulse 502 (FIG. 5) to device 112 and measuring the resulting current ($I_2$).

To place memory element 112 in its third stable state, a "set" pulse 503 (FIG. 5) can be applied. In this situation, when "set" pulse 503 is first applied most of the voltage drop in memory element 112 appears across variable resistance layer 206 as the resistance of variable resistance layer 206 dominates memory element 112. This causes variable resistance layer 206 to transition from its high resistance state to its low resistance state and cause the resistance of memory element 112 to move from load line HRSB to load line HRSC, as indicated by line 50 as shown in FIG. 4. The third stable state of memory element 112 may be sensed by applying a sensing pulse 504 (FIG. 5), and measuring the resulting current ($I_3$).

As noted above, memory element 112 can be placed in its fourth stable state when the "set" pulse 505 is applied. This causes the third variable resistance layer 207 to transition from its high resistance state to its low resistance state. As indicated by line 56 (FIG. 4), the resistance of memory element 112 will transition from the load line HRSC, where the output of the memory element 112 was dominated by the resistance of variable resistance layer 207, to the highest low resistance state, such as transitioning to load line LRSA. In this case, the resistance of the memory element 112 will be dominated by the most resistive of the three low resistance states, such as the low resistance state associate with variable resistance layer 205 (line LRSA). When placed in its fourth stable resistive state in this way, memory element 112 will exhibit a current of ($I_4$) when the sensing pulse 506 is applied.

To reset memory element 112 to its first stable state, from its fourth stable state, a "reset" pulse 507 (corresponding to the "reset" voltage of variable resistance layer 205) is applied across memory element 112. As shown by line 62 in FIG. 4, this causes the resistance of memory element 112 to transition from line LRSA to line HRSA. Following "reset" operations, memory element 112 is in its first stable resistive state. If "sense" pulse 508 (FIG. 5) is applied to memory element 112, the resulting current will be ($I_1$).

The magnitude of the "set" and "reset" voltages may vary, but preferably there is a greater than or equal to 0.5V separation between each of the values. To provide a measurable difference between the various logic "zero" and logic "one" states it is common to form the variable resistance layers 205, 206 and 207 so that the difference between the measured sensing currents, when the sensing pulses 500, 502, 504, 506 and 508 are applied, have a difference of at least one factor of five between adjacent states. In other words, the ratio of the electrical resistances of the variable resistance layer 206 is decreased by at least 5 times when switching between each successive resistance state.

Although the examples of FIGS. 3A, and 3B involve three variable resistance layers, memory element 112 may have any suitable numbers of layers (e.g., two, three, four, five, more than 5, etc.). Moreover, it is not necessary for the low and the high resistance states for the layers to be ordered in relation to their physical order as shown in FIG. 4. Also, in one example, the resistive characteristics of the layers may be such that the position of at least one of the high resistance state or low resistance state curves may be in a different order than what is shown, such as the positions of the LRSB curve and the LRSC curve may be reversed.

In another embodiment, if the resistance of LRSB is greater than LRSA, for example, the memory element 112 exhibits three (or "n") resistance states. For example, in this embodiment, when the memory element 112 receives a "set" pulse 505 (FIG. 5), it transitions from HRSC to LRSB. When a "reset" pulse 507 is first applied to memory element 112 returns the resistance of the device to approximately the line HRSB. The memory element 112, with the resistance of LRSB greater than the resistance of LRSA may then transition between HRSB, HRSC and LRSB, for three states.

As described above, the application of pulses of energy (e.g., pulses 501, 503, 505 and 507) can be used in the programming of memory element 112. For example, a 1 millisecond (ms) to 1 nanosecond (ns) square or trapezoidal shaped pulse can be used to switch the memory element 112. In some embodiments, it may be desirable to adjust the length of the pulse depending on the duration of time needed to switch one or more of the variable resistance layers in memory element 112. In one configuration, each of the "set" and "reset" pulses are about 10 ns in length. Although multi-stable switching has been illustrated in scenarios involving positive "reset" voltages and negative "set" voltages, the voltages, in general need not have the same polarities as described. In one example, the "reset" voltage may have a negative polarity and the "set" voltages a positive polarity. In another example, the "reset" and "set" voltages may have a positive and negative polarity, respectively. In another example, the "reset" and "set" voltages may also have the same polarity either positive or negative.

During programming operations, the magnitude of the energy pulses during the operation of memory device 200 can be adjusted to improve the reliability of the memory element and/or the operating currents and voltages. FIG. 5 illustrates negative "set" programming energy pulses 550, such as pulses 501, 503 and 505, that reflect a consistently delivered energy level, such as a constant "set" current ($I_{SET}$). Achieving a consistent $I_{SET}$ current, requires varying the applied voltage necessary to transition each variable resistance layer 205, 206 and 207 to its low resistance state. While FIG. 5 illustrates one application of programming energy pulses as applied to "set" the multiple variable resistance layers 205, 206 and 207, FIGS. 6A-6C illustrate additional types of programming energy pulses 550 that can be applied to the memory element 112.

Figure 6A:
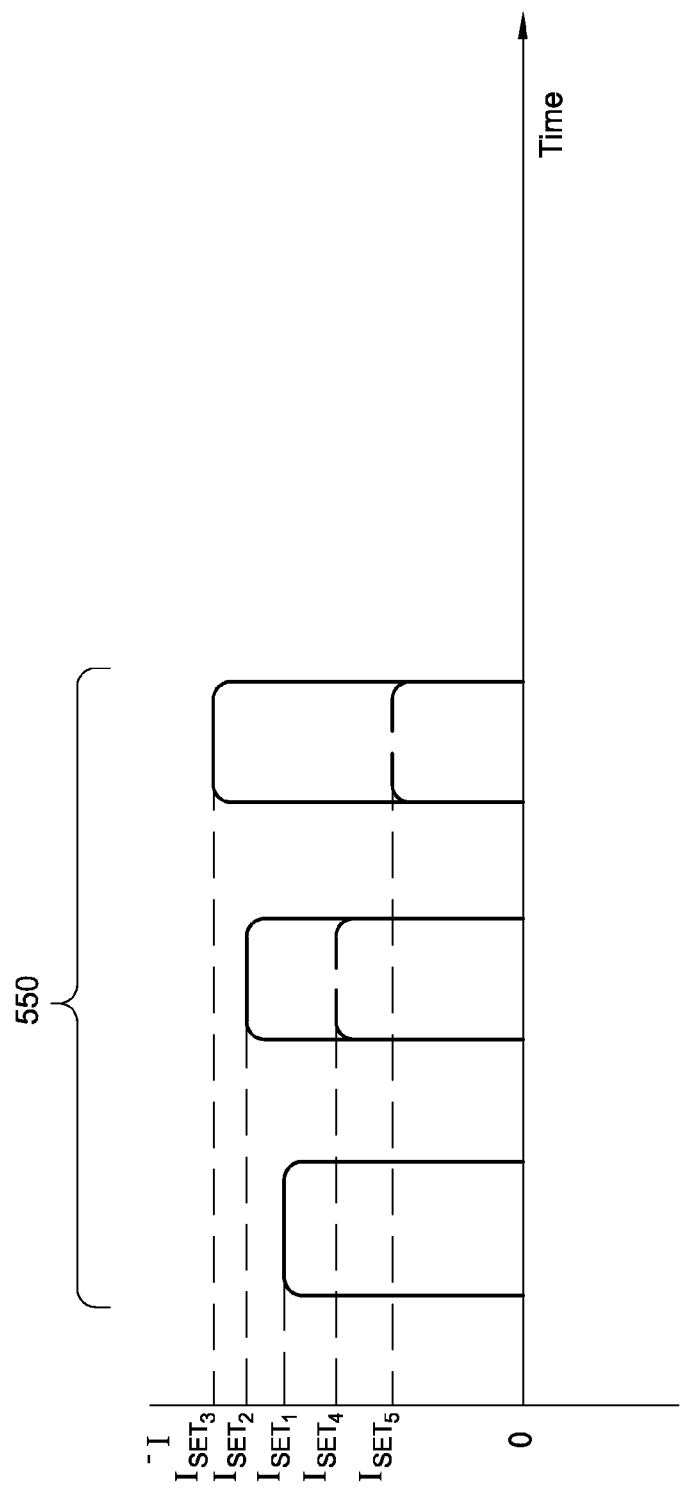

FIG. 6A illustrates a stepped increase in the magnitude of the current applied during each pulse ($I_{SET1}$, $I_{SET2}$ and $I_{SET3}$). In one configuration, this can be achieved by a applying a constant voltage in each pulse. This increase in current reflects the increase in current flowing through memory device 200 due to the reduced resistance of the memory element 112, as each layer is transitioned to its low resistance state (LRS). In another example the Alternatively, the magnitude of both the current and voltage can be adjusted to reliably operate the memory device 200 and decrease the applied current required for each pulse, as the resistance of each layer is reduced to its low resistance state.

For example, referring to both FIGS. 4 and 6A, when keeping the magnitude of the voltage constant throughout the switching process, the current $I_{SET1}$ is necessary to switch the highest resistance layer, such as variable resistance layer 205 to its low resistance state (LRSA). As variable resistance layer 206 is now the layer that has the highest resistance (HRSB), which is lower than (HRSA), applying the same voltage will cause a current $I_{SET2}$, to flow through the memory element, since the variable resistance layer 206 is transitioned to its low resistance state (LRSB). Upon the transition of variable resistance layer 206 to its low resistance state, variable resistance layer 207 is now the layer with the highest resistance (HRSC) in memory element 112. Again, applying the same voltage to the memory element 112 will cause a current $I_{SET3}$, to flow as variable resistance layer 207 transitions to its low resistance state (LRSC), thus providing an increased current applied to switch each layer.

In an alternative switching process, referring again to FIG. 6A, once variable resistance layer 205 has transitioned to its low resistance state (LRSA), variable resistance layer 206 becomes the layer of highest resistance (HRSB). Because memory element 112 is in a reduced resistance state (HRSB as opposed to HRSA), both the voltage and current ($I_{SET4}$) necessary to switch variable resistance layer 206 from HRSB to LRSB, is less than the current ($I_{SET1}$) and voltage required to transition variable resistance layer 205. Once variable resistance layer 206 has transitioned to its low resistance state (LRSB), variable resistance layer 207 becomes the most resistive layer, and memory element 112 is in a further state of reduced resistance. Due to this lower resistance, a reduced magnitude of both current ($I_{SET5}$) and voltage can be tailored to transition or "set" memory element 112 from its high resistance state (HRSC) to its lower resistance state (LRSA). Careful management of the magnitude of both operating voltages and currents as they relate to the conditions of the variable resistance layers can lead to reduced power requirements and enhanced performance.

FIG. 6B illustrates another example of the methodology that can be used to apply "set" programming energy pulses 550 to program memory element 112 that contains variable resistance layers 205, 206 and 207 by applying programming energy pulse 550. FIG. 6B illustrates the cases where the application of multiple pulses can be used to enable the switching of the variable resistance layers 205, 206 and 207. For example, pulse 601 is applied to switch a first variable resistance layer 205 from its high resistance state to its low resistance state. To switch variable resistance layer 206 to from its high resistance state to its low resistance state, two pulses 602 and 603 are applied to memory element 112, while three pulses 603-605 may be used to switch variable resistance layer 207 from its high resistance state to its low resistance state. Of course, this example is only representative of the use of multiple pulses to enable the switching of variable resistance layers, and the actual number used here is not meant to be limiting, as any appropriate number of pulses may be used to enable the actual switching of the layers.

FIG. 6C illustrates an alternate programming process in which the magnitude and/or time that each of the pulses of the series of programming energy pulses 550 are adjusted as necessary to enable the improved switching of each individual layer. In one embodiment, the magnitude of the voltage pulse, current pulse and/or duration of each pulse can be varied to improve the switching characteristics of the memory element 112. As an example, pulse 601 may be applied for between 30 and 50 nanoseconds (ns) to switch variable resistive layer 205 from its high resistance state to its low resistance state. Due to the decreased resistance of memory element 112 as variable resistance layer 206 is now the layer that has the highest resistance, a second pulse 611 can be applied for a longer duration of time, for example between 15 and 25 (ns) to achieve the switching between its high and low resistance states. As variable resistance layer 207 is now the layer of highest resistance and memory element 112 is now in a further reduced state of resistance, pulse 612 may be applied for an even longer duration of time, from between 5 and 10 (ns) to achieve the necessary switching of variable resistance layer 207 to its low resistance state. In this example by tailoring the time and magnitude of the voltage pulse, the current pulse for the variable resistance layers 205, 206 and 207 will have the same magnitude. As another example, pulse 601, 602 and 603 all comprise a current pulse or voltage pulse pulsed for the same duration of time. Again these examples are not meant to be limiting, but to merely illustrate that the period of time a pulse is applied can be varied to enable the switching of variable resistance layer 205, 206 and 207.

As stated above, none of these examples are intended to be limiting as one skilled in the art would appreciate the variations in magnitude of the energy applied to each layer to cause it to switch to a different resistive state such as by varying the current, voltage, time and/or the number of applied pulses that can be varied to operate and manage the switching of memory element 112 in memory device 200.

In an effort to prepare the memory element 112 for use, it is common to apply a forming voltage ($V_{FORM}$) at least once across the electrodes 102, 118 to "burn-in" the device. It is believed that the application of a forming voltage, which is typically significantly greater than the $V_{RESET}$ and $V_{SET}$ voltages, causes the defects that are formed within the variable resistance layers 205, 206 and 207 during the device fabrication process to move, align and/or collect within various regions of the formed layer, causing the variable resistance layers to consistently and reliably switch between the "on" and "off" resistive states throughout the memory element's life. In one configuration, the forming voltage is between about 1 and about 5 times greater than the maximum "set" or "reset" voltages. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form the memory element 112 so that the application of a forming voltage is not required at all to assure that the device will perform as desired throughout its life.

Because the new memory device 200 having variable resistance layers increases the number of logic states per memory element, the use of multiple layers of variable resistance materials also decreases the density of the memory required to achieve the same nonvolatile storage capacity. This decrease in physical density allows memory array 100 (FIG. 1), to be placed in a smaller area of the memory chip. In one example, the memory density can be decreased by stacking the memory elements 112 in a vertical fashion to make multilayer memory arrays as shown in FIGS. 7A and 7B and increase the density of the memory array 300.

Figure 7A:
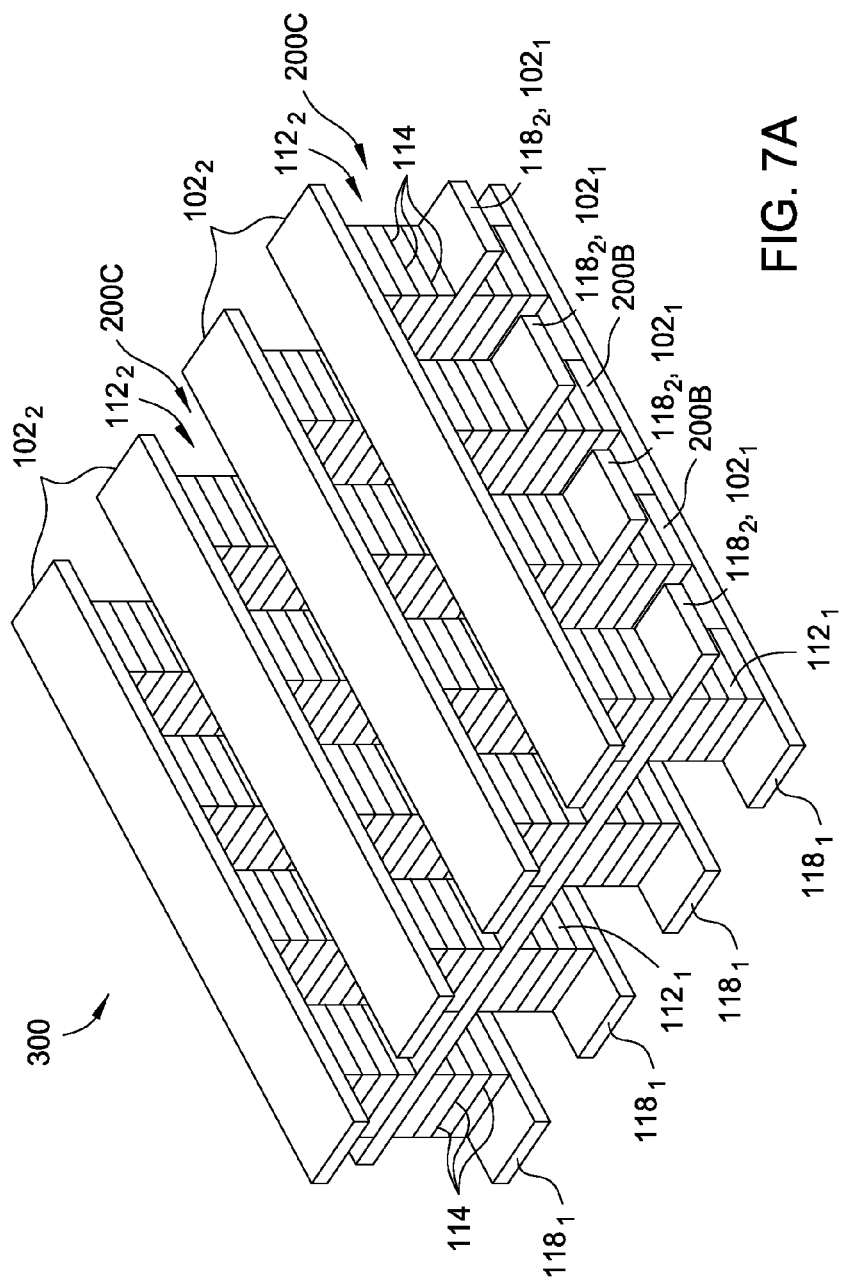
FIG. 7A illustrates an array of stacked memory elements in accordance with an embodiment of the invention.

An illustrative vertical stack memory array 300 of nonvolatile memory elements $112_1$ and $112_2$ is shown in FIG. 7A. In this example, the conductive layer $102_1$ in memory element $112_1$ and the first conductive layer $118_2$ in memory element $112_2$ are joined together, and thus are coupled to multiple switching memory devices 200B and 200C. Read and write circuitry is connected to memory elements $112_1$ and $112_2$ via conductive layers $118_1$, $102_1$, $118_2$ and $102_2$. Both memory elements $112_1$ and $112_2$ may be formed from multiple layers of variable resistance materials as indicated schematically by lines 114 (FIG. 7A).

Figure 7B:
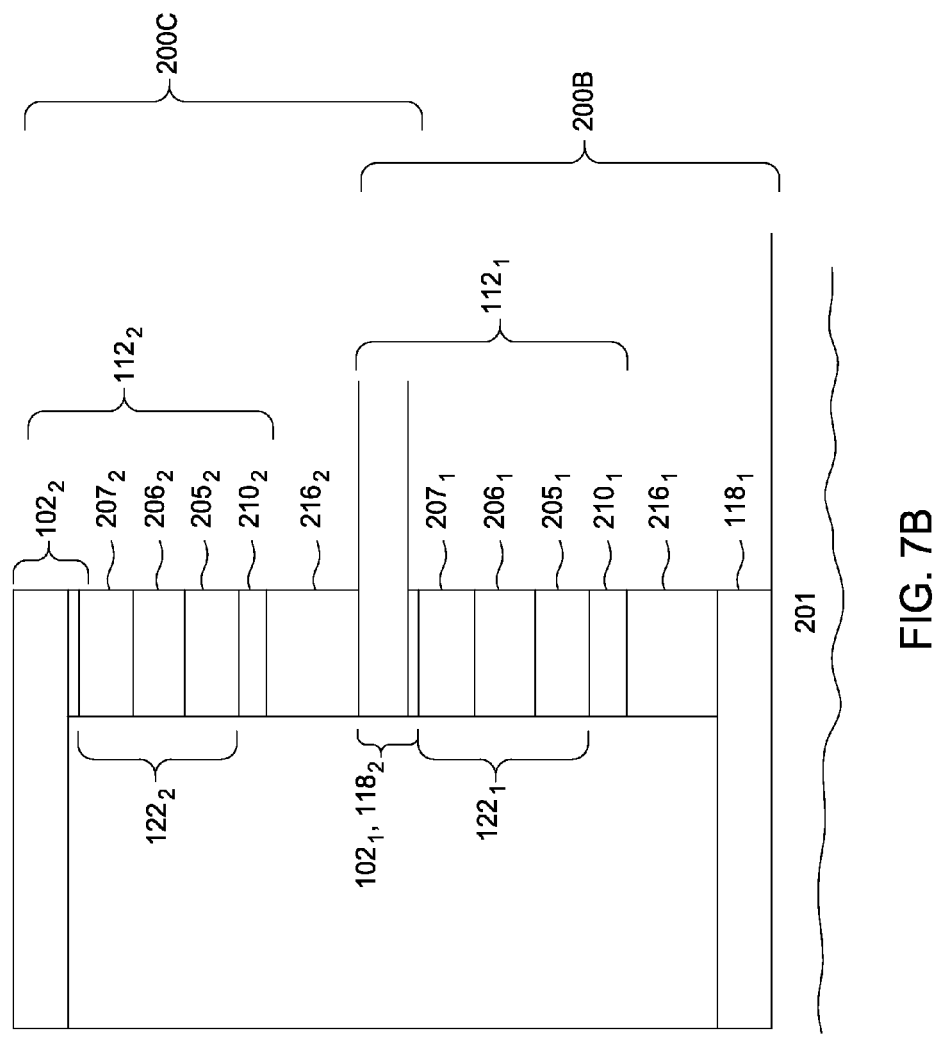
FIG. 7B is a schematic side cross-sectional view of stacked memory elements of the type illustrated in FIG. 7A.

FIG. 7B is a schematic side cross-sectional view of vertical stack memory array 300 of nonvolatile memory elements $112_1$ and $112_2$ as shown in FIG. 7A. Switching memory device 200B contains memory element $112_1$ which contains multistate variable resistance element $122_1$ comprising three resistance switching layers $205_1$, $206_1$ and $207_1$. Variable resistance layers $205_1$, $206_1$ and $207_1$ are connected in series with and disposed between electrodes $102_2$, $118_2$ and $118_1$ and formed over a portion of a substrate 201. In this example, memory element $112_1$, of switching memory device 200B, may exhibit four different stable resistive states. In this configuration, memory element $112_1$ will generally contain a top electrode $102_1$, variable resistance layers $205_1$, $206_1$ and $207_1$, an intermediate electrode $210_1$, a current steering device $216_1$, and bottom electrode $118_1$. Variable resistance layers $205_1$, $206_1$ and $207_1$ preferably each have a different respective associated "set" voltage, so that the state of each of the variable resistance switching layers can be controlled independently. The variable resistance layers $205_1$, $206_1$ and $207_1$ may be arranged in any suitable order. Switching memory device 200B and switching memory device 200C share electrode $102_1$, $118_2$ resulting in fewer manufacturing process steps when stacking switching memory devices as shown here. Switching memory device 200C contains multistate variable resistance element $122_2$ made of three variable resistance layers $205_2$, $206_2$ and $207_2$ that are connected in series with and disposed between electrodes $102_1$, $118_2$ and $102_2$. The switching memory device 200C contains memory element $112_2$ that, like memory element $112_1$, may exhibit four different stable resistive states. In this configuration, the memory element $112_2$ will generally contain a top electrode $102_2$, variable resistance layers $205_2$, $206_2$ and $207_2$, an intermediate electrode $210_2$, a current steering device $216_2$, and bottom electrode $102_1$, $118_2$. Variable resistance layers $205_2$, $206_2$ and $207_2$ preferably each have a different respective associated programming voltage, so that the state of each of the variable resistance layers can be controlled independently. The variable resistance layers $205_2$, $206_2$ and $207_2$ may be arranged in any suitable order.

With switching memory device 200B and switching memory device 200C stacked vertically as described above, each device 200B and 200C can be addressed independently or in combination by using the appropriate set of conductive layers $102_2$, $118_2$ and $118_1$ to allow additional logic states to be stored. In one example, where memory elements $112_1$ and $112_2$ each contain "n" layers the total logic states addressable by the logic circuitry will be "2n+2" states.

Device Structure and Formation Processes

In one embodiment, as discussed above and referring back to FIG. 1, memory array 100 comprises a plurality of switching memory devices 200 that are each interconnected by the electrodes 102 and 118. As illustrated in FIG. 3A, switching memory device 200 may comprise a top electrode 102, variable resistance layers 205, 206 and 207, an optional intermediate electrode 210 (additional conductive layer), a current steering device 216 and an electrode 118. In one configuration, as noted above, the current steering device 216 comprises a p-n junction diode, p-i-n diode, transistor, or other similar device that is disposed between electrode 102 and memory element 112, or between electrode 118 and memory element 112. In one example, the current steering device 216 may include two or more layers of a semiconductor material, such as two or more doped silicon layers, that are configured to direct the flow of current through the device. In one example, the current steering device is a diode that comprises a p-doped silicon layer (not shown), an un-doped intrinsic layer (not shown), and an n-doped silicon layer (not shown) that has an overall resistance between about 1kΩ and about 100 MΩ. The overall resistance will generally depend on the type of current steering device that is formed and in what direction current is flowing through the device (e.g., forward or reversed biased).

The electrodes 102, 210 and 118 disposed in the switching memory device 200B are generally formed from a conductive material that has a desirable conductivity and work function. In some configurations, the electrodes 102, 210 and/or 118 disposed in the switching memory device 200 are each formed from different materials, which may include, but are not limited to p-type polysilicon, n-type polysilicon, transition metals, transition metal alloys, transition metal nitrides, and transition metal carbides. In one example, the electrode 102 and the electrode 118 comprise a metal, metal alloy, metal nitride or metal carbide formed from an element selected from a group consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combination thereof. In one example, the electrodes 102 and 118 comprise a metal alloy selected from the group of a titanium/aluminum alloy, or a silicon-doped aluminum (AlSi). In one embodiment of the switching memory devices 200, the electrodes 102 and 118 comprise a metal, such as a transition metal, transition metal alloy, transition metal carbide, transition metal nitride (e.g., TiN), and the intermediate electrode 210 comprises a heavily doped semiconductor material, such as a heavily doped silicon material (e.g., n-type polysilicon material) that interfaces well with the current steering device 216. In one example, the intermediate electrode 210 comprises polysilicon and is between about 50 Å and about 500 Å thick, and the electrodes 102 and 118 are between about 50 Å and 5000 Å thick and comprise a metal, such as titanium nitride (TiN).

Switching Memory Device Fabrication Processes

Figure 8:
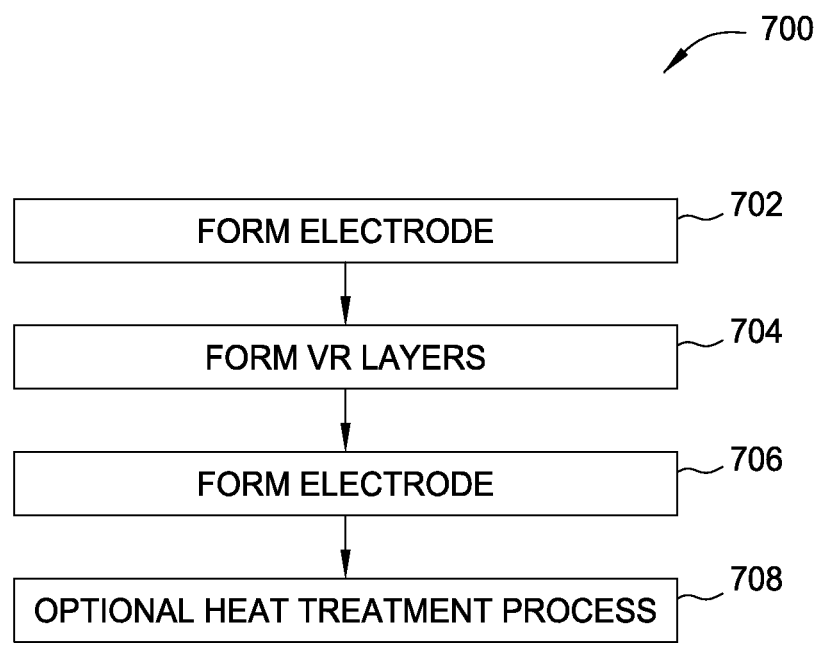
FIG. 8 is a schematic depiction of a process for forming the switching memory device according to one embodiment of the invention.

FIG. 8 illustrates a process sequence 700 that can be used to form memory element 112 components in a switching memory device 200 illustrated in FIG. 3A, according to one embodiment of the invention. While omitted from the discussion below, the electrode 118 and current steering device 216 elements can be formed over a portion of a substrate 201, such as a silicon substrate, by use of a physical vapor deposition (PVD), chemical vapor deposition (CVD), atomic layer deposition (ALD), or other similar process that is well known in the art. In one example, the current steering device 216 is a diode that comprises a p-doped silicon layer (not shown) that is formed by a CVD process, an un-doped intrinsic layer (not shown) that is formed by an CVD process, and an n-doped silicon layer (not shown) that is formed by a CVD process. In one example, the electrode 118 comprises a layer of titanium nitride (TiN) that is between about 500 Å and 1 µm thick and is formed by use of a PVD process.

Referring to FIGS. 3A and 8, at step 702 an intermediate electrode 210 is formed over a substrate 201. In one embodiment, the intermediate electrode 210 is a highly doped polysilicon layer that is formed using a conventional CVD (e.g., LPCVD) or ALD type polysilicon deposition technique. In some cases, an optional native oxide layer removal step may be performed after forming the intermediate electrode layer 210 by use of a wet chemical processing technique, or conventional dry clean process that is performed in a plasma processing chamber. In one example, the intermediate electrode 210 comprises polysilicon that is between about 50 Å and about 5000 Å thick, which is formed by use of a CVD or ALD polysilicon deposition process.

Referring to FIGS. 3A and 8, at step 704, the variable resistance layers 205, 206 and 207 are deposited over the intermediate electrode 210 using a PVD, CVD or ALD deposition process. Each variable resistance layer 205, 206 and 207 may comprise a metal oxide layer, such as $Hf_xO_y$, $Ta_xO_y$, $Al_xO_y$, $La_xO_y$, $Y_xO_y$, $Dy_xO_y$, $Yb_xO_y$, $Lu_xO_y$, $Lu_xAl_yO_z$, $La_xLu_yO_z$ and/or $Zr_xO_y$, formed to a thickness of between about 10 Å and about 100 Å, such as between about 15 Å and about 50 Å. The variable resistance layers 205, 206 and 207 can be deposited using any desired technique, but in some embodiments described herein is deposited using an ALD process. In one example, variable resistance layers 205, 206 and 207 all comprise the same material and are deposited by an ALD process using Tris(i-propylcyclopentadienyl)lanthanum and an oxygen containing precursor (e.g., water vapor) at a temperature of about 250° C. is used to form three lanthanum oxide ($La_xO_y$) variable resistance layers each with a different thickness corresponding to the desired resistance of each layer as necessitated by overall specification requirements. In a preferred embodiment, when using the same material for variable resistance layers 205, 206 and 207, there may be an interfacial conductive layer 215 adjacent to each variable resistance layer to further differentiate variable resistance layers 205, 206 and 297, as shown in FIG. 3B. The interfacial conductive layers 215 may be formed of any suitable conductive material. For example, from metals such as refractory or transition metals, metal alloys, metal nitrides (e.g. refractory metal nitrides, $Ti_{1-x}Al_xN_y$, $Ta_{1-x}Al_xN_y$, $W_{1-x}Al_xN_y$, $Mo_{1-x}Al_xN_y$, etc.) metal silicon nitrides (i.e., materials containing refractory metals, transition metals, or other metals, along with silicon and nitrogen), metal silicides, doped semiconductors, or other conductors. Other intermediate layers having various functions may also be included.

In another example, the variable resistance layers 205, 206 and 207 each have a different resistance, one of the layers contains metal oxide from the group of $Hf_xO_y$, $Ta_xO_y$, $Al_xO_y$, $Y_xO_y$, $Dy_xO_y$, $Yb_xO_y$, $Lu_xO_y$, $Lu_xAl_yO_z$, $La_xLu_yO_z$ and/or $Zr_xO_y$, and two of the layers both comprise the same material, lanthanum oxide ($La_xO_y$). In this case, the layers of lanthanum oxide are deposited by using an ALD process using Tris(i-propylcyclopentadienyl)lanthanum and an oxygen containing precursor (e.g., water vapor) at a temperature of about 250° C. and one of the two lanthanum oxide layers is doped with a chemical element to modify the materials resistance to meet device specifications. Typical dopants include chemical element materials that have an affinity for oxygen (e.g., transition metals (Al, Ti, Zr, Co, V, Nb)).

In yet another example, variable resistance layers 205, 206 and 207 all comprise the same material, and the desired resistance of each layer is achieved by modifying the deposition or adding one or more post process techniques. In this example, by controlling the number of defects in the formed variable resistance layers, such as by adjusting the stoichiometry of the material(s) found in the variable resistance layer (the ratio of a first chemical element to the second chemical element (e.g., $HfO_{1.7}$ vs. $HfO_2$)) during the layer formation process, resistivity of the materials can be tailored to meet device specifications. Adjusting of the oxygen content of the oxygen containing precursor (e.g., water vapor) during the layer formation process modifies the stoichiometry of the material.

In another example, variable resistance layers 205, 206 and 207 each having a different resistance are deposited by selecting different materials for each layer, based on each materials resistivity. The different material layers can be selected from the group of $Hf_xO_y$, $Ta_xO_y$, $Al_xO_y$, $La_xO_y$, $Y_xO_y$, $Dy_xO_y$, $Yb_xO_y$, $Lu_xO_y$, $Lu_xAl_yO_z$, $La_xLu_yO_z$ and/or $Zr_xO_y$.

At step 706 the electrode 102 is formed over the resistive layer 204 as shown in FIG. 3A, using one or more of the materials that are discussed above. The electrode 102 layer may be deposited using a deposition process, such as a PVD, CVD, ALD or other similar process. In one example, the electrode layer 102 is between about 100 Å and 1000 Å thick. In one example, a PVD process is used to form an electrode 102 layer that comprises titanium nitride (TiN) and is between about 100 Å and 1000 Å thick.

At step 708, the formed switching memory device 200 is optionally annealed at a temperature of greater than about 450° C. In one example, the formed switching memory device 200 is annealed at a temperature of greater than about 600° C. In another example, the formed switching memory device 200 is annealed at a temperature of between about 450° C. and about 1000° C. for a period of time between about 10 seconds and about 20 minutes. The process(es) performed at step 708, are generally configured to cause the layers disposed in the switching memory device 200 form a desirable interface between the adjacent layers (e.g., electrode 102 and the variable resistive layers 205), as well as activate and/or desirably process the other layers formed in the switching memory device.

Process and Device Examples

In one example of a process of forming a switching memory device, after performing the steps 702-708 in the processing sequence 700, and referring to FIG. 3A, a memory element 112 is formed that comprises: an intermediate electrode 210 comprising an n-doped polysilicon layer, variable resistance layers 205, 206 and 207 that are each about 15 Å to 50 Å thick and comprise a metal oxide, such as lanthanum ($LaO_x$), hafnium oxide ($HfO_x$), or aluminum oxide ($AlO_x$), that each have a different stoichiometry, and an electrode 102 that comprises a layer of titanium nitride (TiN). After forming the switching memory device 200 (FIG. 3A), then at least one thermal processing step (e.g., rapid thermal anneal) is performed, such as step 708, to form switching memory device 200.

In another example of a process of forming a switching memory device, after performing the steps 702-708, a memory element 112 is formed that comprises: an intermediate electrode 210 comprising an n-doped polysilicon layer, variable resistance layers 205, 206 and 207, where layer 205 is 60 Å thick, layer 206 is 30 Å thick and layer 207 is 15 Å thick and each comprise a metal oxide, such as yttrium oxide ($YO_x$), hafnium oxide ($HfO_x$), or aluminum oxide ($AlO_x$) and an electrode 102 that comprises a layer of titanium nitride (TiN). After forming the switching memory device 200, then at least one thermal processing step is performed, such as step 708, to form switching memory device 200.

In another example of a process of forming a switching memory device, after performing the steps 702-708, a memory element 112 is formed that comprises: an intermediate electrode 210 comprising an n-doped polysilicon layer, variable resistance layers 205, 206 and 207, where each variable resistance layer comprises a different materials. In this example, one variable resistance layer comprises lanthanum oxide ($LaO_x$), a second variable resistance layer comprises hafnium oxide ($HfO_x$) and a third variable resistance layer comprises aluminum oxide ($AlO_x$). The memory element 112 includes electrode 102 that comprises a layer of titanium nitride (TiN). After forming the switching memory device 200, then at least one thermal processing step is performed, such as step 708, to form switching memory device 200.

In another example of a process of forming a switching memory device, after performing the steps 702-708, a memory element 112 is formed that comprises: an intermediate electrode 210 comprising an n-doped polysilicon layer, variable resistance layers 205, 206 and 207, where each variable resistance layer comprises a different materials. In this example, one variable resistance layer comprises yttrium oxide ($YxO_x$), a second variable resistance layer comprises hafnium oxide ($HfO_x$) and a third variable resistance layer comprises aluminum oxide ($AlO_x$). The memory element 112 includes electrode 102 that comprises a layer of titanium nitride (TiN). After forming the switching memory device 200, then at least one thermal processing step is performed, such as step 708, to form switching memory device 200.

In another example of a process of forming a switching memory device, after performing the steps 702-708, a memory element 112 is formed that comprises: an intermediate electrode 210 comprising an n-doped polysilicon layer, variable resistance layers 205, 206 and 207, where each variable resistance layer comprises a different materials. In this example, one variable resistance layer comprises dysprosium oxide ($DyO_x$), a second variable resistance layer comprises hafnium oxide ($HfO_x$) and a third variable resistance layer comprises aluminum oxide ($AlO_x$). The memory element 112 includes electrode 102 that comprises a layer of titanium nitride (TiN). After forming the switching memory device 200, then at least one thermal processing step is performed, such as step 708, to form switching memory device 200.

In another example of a process of forming a switching memory device, after performing the steps 702-708, a memory element 112 is formed that comprises: an intermediate electrode 210 comprising an n-doped polysilicon layer, variable resistance layers 205, 206 and 207, where each variable resistance layer comprises a different materials. In this example, one variable resistance layer comprises ytterbium oxide ($YbO_x$), a second variable resistance layer comprises hafnium oxide ($HfO_x$) and a third variable resistance layer comprises aluminum oxide ($AlO_x$). The memory element 112 includes electrode 102 that comprises a layer of titanium nitride (TiN). After forming the switching memory device 200, then at least one thermal processing step is performed, such as step 708, to form switching memory device 200.

The foregoing is merely illustrative of the principles of this invention and various modifications can be made by those skilled in the art without departing from the scope and spirit of the invention as defined by the claims that follow.

The invention claimed is:

1. A multistate nonvolatile memory element comprising:
a first layer operable as a first variable resistance layer,
the first layer configured to switch between a first low resistance state and a first high resistive state;
a second layer operable as a second variable resistance layer,
the second layer connected in series with the first layer,
the second layer configured to switch between a second low resistance state and a second high resistance state;
a third layer operable as a third variable resistance layer,
the third layer connected in series with the first layer and the second layer, and
the third layer configured to switch between a third low resistance state and a third high resistance state; and
wherein each of the first layer, the second layer and the third layer comprises a first chemical element and a second chemical element, and
wherein a ratio of the first chemical element to the second chemical element is different in each of the first layer, the second layer and the third layer, and
wherein the multistate nonvolatile memory element has at least four different stable resistive states.

2. The multistate nonvolatile memory element of claim 1, wherein one of the first layer, the second layer, or the third layer comprises a material selected from the group consisting of yttrium oxide, ytterbium oxide, dysprosium oxide and lanthanum oxide.

3. The multistate nonvolatile memory element of claim 1, wherein the first layer comprises a first material selected from the group consisting of yttrium oxide, ytterbium oxide, dysprosium oxide and lanthanum oxide.

4. The multistate nonvolatile memory element of claim 3, wherein the second layer comprises a second material selected from the group consisting of yttrium oxide, ytterbium oxide, dysprosium oxide and lanthanum oxide, and wherein the second material is different from the first material.

5. The multistate nonvolatile memory element of claim 3, wherein the second layer comprises a second material selected from the group consisting of yttrium oxide, ytterbium oxide, dysprosium oxide and lanthanum oxide, wherein the second layer further comprises a dopant.

6. The multistate nonvolatile memory element of claim 5, wherein the dopant comprises a material selected from the group consisting of aluminum, titanium, zirconium, cobalt, vanadium and niobium.

7. The multistate nonvolatile memory element of claim 1, wherein the first layer comprises hafnium oxide, and the second layer comprises a material selected from the group consisting of yttrium oxide, ytterbium oxide, dysprosium oxide and lanthanum oxide.

8. The multistate nonvolatile memory element of claim 1, wherein the third layer is doped with a chemical element selected from the group consisting of aluminum, titanium, zirconium, cobalt, vanadium and niobium.

9. The multistate nonvolatile memory element of claim 1, wherein the first layer comprises hafnium oxide.

10. The multistate nonvolatile memory element of claim 1, wherein the first layer comprises aluminum oxide.

11. The multistate nonvolatile memory element of claim 10, wherein the second layer comprises a material selected from the group consisting of hafnium oxide, tantalum oxide and zirconium oxide.

12. The multistate nonvolatile memory element of claim 11, wherein the third layer comprises a material selected from the group consisting of yttrium oxide, ytterbium oxide, dysprosium oxide and lanthanum oxide.

13. The multistate nonvolatile memory element of claim 1, wherein the first layer comprises aluminum oxide, the second layer comprises hafnium oxide, and the third layer comprises lanthanum oxide.

14. The multistate nonvolatile memory element of claim 1, wherein the first layer comprises aluminum oxide, the second layer comprises hafnium oxide, and the third layer comprises a material selected from the group consisting of lanthanum oxide, yttrium oxide, ytterbium oxide and dysprosium oxide.

15. The multistate nonvolatile memory element of claim 1, wherein the first layer comprises a material selected from the group consisting of aluminum oxide, hafnium oxide, tantalum oxide and zirconium oxide, the second layer comprises a material selected from the group consisting of lanthanum oxide, yttrium oxide, dysprosium oxide and ytterbium oxide, and the third layer comprises a material selected from the group consisting of lanthanum oxide, yttrium oxide, ytterbium oxide, dysprosium oxide, aluminum oxide, hafnium oxide, tantalum oxide and zirconium oxide.

* * * * *